United States Patent [19]
Sharpe

[11] Patent Number: 5,949,281
[45] Date of Patent: Sep. 7, 1999

[54] SELF ALIGNING PLL DEMODULATOR

[75] Inventor: Claude Andrew Sharpe, McKinney, Tex.

[73] Assignee: Texas Instruments Incorporated, Dallas, Tex.

[21] Appl. No.: 08/993,640

[22] Filed: Dec. 18, 1997

Related U.S. Application Data

[60] Provisional application No. 60/033,615, Dec. 19, 1996.
[51] Int. Cl.$^6$ ........................................... H03D 3/24
[52] U.S. Cl. ........................... 329/325; 375/376; 455/260
[58] Field of Search ..................................... 329/302, 306, 329/307, 308, 309, 325, 326; 375/376; 455/260

[56] References Cited

U.S. PATENT DOCUMENTS 4,963,831  10/1990  Stuivenwold et al. ................... 329/325

*Primary Examiner*—Siegfried H. Grimm
*Attorney, Agent, or Firm*—W. James Brady III; Richard L. Donaldson

[57] ABSTRACT

A demodulator (200) including a phase detector (201) receiving a modulated signal and outputting a demodulated signal. The phase detector (201) also receives a reference signal. A programmable voltage circuit (203, 204) outputs an analog voltage. A reference signal generator (208) that is responsive to the programmable voltage circuit (204) and the demodulated signal has an output coupled to provide the reference signal to the phase detector (201). A window detect circuit (206) with an input coupled to the demodulated signal generates an inhibit signal when the demodulated signal is within preselected limits. The inhibit signal is coupled to latch the programmable voltage circuit (203, 204). Preferably, the programmable voltage circuit is implemented as a digital-to-analog converter (204) driven by a counter (203) or by a processor circuit (302).

18 Claims, 1 Drawing Sheet

SELF ALIGNING PLL DEMODULATOR

BACKGROUND OF THE INVENTION

This application claims priority under 35 USC § 119(e)(1) of U.S. provisional application No. 60/033,615 filed Dec. 19, 1996.

FIELD OF THE INVENTION

The present invention relates to phase locked loops and, more particularly, to a phase locked loop that self aligns for use in a receiver.

RELEVANT BACKGROUND

Phase locked loops (PLLs) are used in communication equipment to demodulate audio or data signals from a frequency modulated (FM) or phase modulated (PM) carrier. In an FM or PM signal, the carrier signal is subtracted from the modulated signal to extract the demodulated audio or signal data. Because the carrier frequency may deviate as a result of age or environmental condition in both the transmitter and receiver, it is usually impractical to simply subtract a fixed-frequency continuous wave signal from the modulated signal. This process is complicated because the FM and PM signals in the IF signal make the carrier appear to have a constantly varying frequency as seen by the demodulator circuitry.

Because of this constantly varying carrier frequency and narrow bandwidth, each demodulator is manually aligned so that the nominal carrier frequency of the IF input signal is in the center of the demodulator's lock-in range. In the past, this alignment has been performed by the demodulator circuit manufacturer. It is desirable to have a demodulator that can perform the alignment process automatically. Also, because the manual alignment is an expensive procedure, realignment of an older receiver in the field was cost prohibitive and impractical.

A PLL demodulator is different from a PLL local oscillator (LO) used for frequency synthesis in a radio receiver. In a local oscillator circuit, the PLL is used to synthesize a reference frequency that is applied to a mixer to generate an intermediate frequency (IF) signal. In contrast, a demodulator serves to extract the data or audio signal from the IF signal. Hence, a demodulator desirably has a narrow bandwidth and very small lock-in range in which phase lock can occur. Because of the narrow bandwidth, the demodulator will not operate unless it is precisely aligned.

It is desirable to form PLL demodulators both as separate integrated circuits (ICs) and as complex circuits integrated with many receiver components integrated on a single IC chip. Complementary metal oxide semiconductor (CMOS) technology is well known as a cost efficient technology for mass production of electronic circuits. CMOS devices use minimal power when they are in a static (i.e., non-switching) state. Commercially available CMOS processing circuits including microprocessors and digital signal processors are often used to control receiver functions. Because these processors are already available in the receiver, it is both cost efficient and power efficient to implement additional demodulator functionality using circuitry already existing in the receiver controller processor.

SUMMARY OF THE INVENTION

The present invention involves a demodulator including a phase detector receiving a modulated signal and outputting a demodulated signal. The phase detector also receives a reference signal. A programmable voltage circuit outputs an analog voltage. A reference signal generator that is responsive to the programmable voltage circuit and the demodulated signal has an output coupled to provide the reference signal to the phase detector. A window detect circuit with an input coupled to the demodulated signal generates an inhibit signal when the demodulated signal is within preselected limits. The inhibit signal is coupled to latch the programmable voltage circuit. Preferably, the programmable voltage circuit is implemented as a digital-to-analog converter driven by a counter or by a processor circuit.

In operation, a demodulated signal is generated having a value proportional to a detected phase difference between the modulated signal and a continuous wave reference signal. Preferably, the demodulated signal is filtered using a narrow bandwidth loop filter. During alignment, an analog alignment signal is automatically incremented until the filtered demodulated signal is within a preselected voltage window. The analog alignment signal and the filtered demodulated signal are added to generate an analog reference signal. The analog reference signal is converted into the continuous wave reference signal.

DETAILED DESCRIPTION OF THE PREFERRED EMBODIMENTS

A demodulator stage of a radio frequency (RF) receiver accepts an intermediate frequency (IF) signal from a previous tuning stage. The demodulated output is coupled to analog processing circuitry such as an amplifier or speaker, or to a detector to detect digital data. Typical IF frequencies are at 455 kHz, 10.7 MHz, 16.2 MHz, however, any IF frequency may be used in accordance with the teachings of the present invention.

The PLL demodulator in accordance with the present invention serves to extract the modulated data or audio signal from the IF signal. In contrast to frequency synthesizers, a demodulator must lock onto a carrier frequency whose exact frequency is unknown and is continuously changing due to the continuously varying data and voice signal. Although the IF carrier frequency is roughly known in any system, demodulator stages have very narrow bandwidth and small lock-in range. Hence, the demodulation cannot occur accurately through simple frequency synthesis as is done in the earlier stages. Instead, each demodulator is precisely aligned to the center of the expected IF carrier to compensate for drift in the IF signal.

Figure 1:
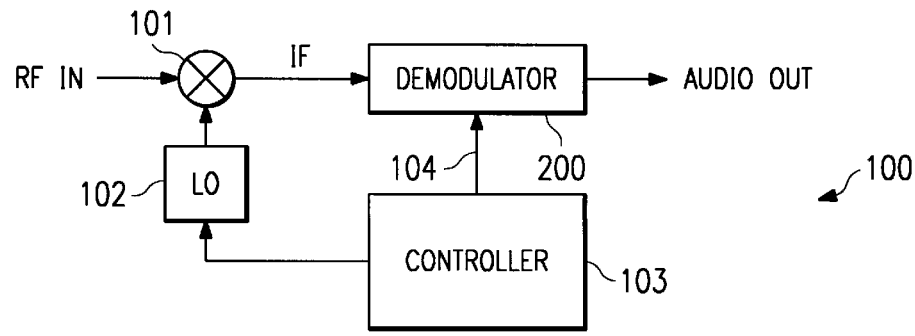
FIG. 1 illustrates a receiver in block diagram form in accordance with one embodiment of the present invention.

FIG. 1 shows an RF receiver 100 in block diagram form. The RF signal is input to mixer 101. The local oscillator 102 generates a reference frequency that is also applied to one input of mixer 101. Channel selection is performed by varying the output frequency of local oscillator 102 based upon the carrier frequency of a particular channel in the RF input signal so as to generate a roughly constant IF signal.

Demodulator 200 extracts the modulated data or voice signal from the IF signal to generate an audio output signal. Errors in the IF signal center frequency can be created by drift in local oscillator 102 or mixer 101, temperature variation of components, tuning range tolerance of the modulation side bands in the transmitter, and the like. Demodulator 200 in accordance with the present invention compensates for these sources of variation and can be realigned when desired by an initiate alignment command applied to demodulator 200 on line 104.

The initiate alignment and channel selection commands applied to demodulator 200 and local oscillator 102 may be manually applied. In a preferred embodiment, receiver 100 includes a controller 103 such as a dedicated microcontroller or microprocessor that generates the initiate alignment command when necessary and handles channel tuning through frequency selection of local oscillator 102. Other techniques for generating and applying receiver control signals are known and may be used in the implementation of the present invention.

Figure 2:
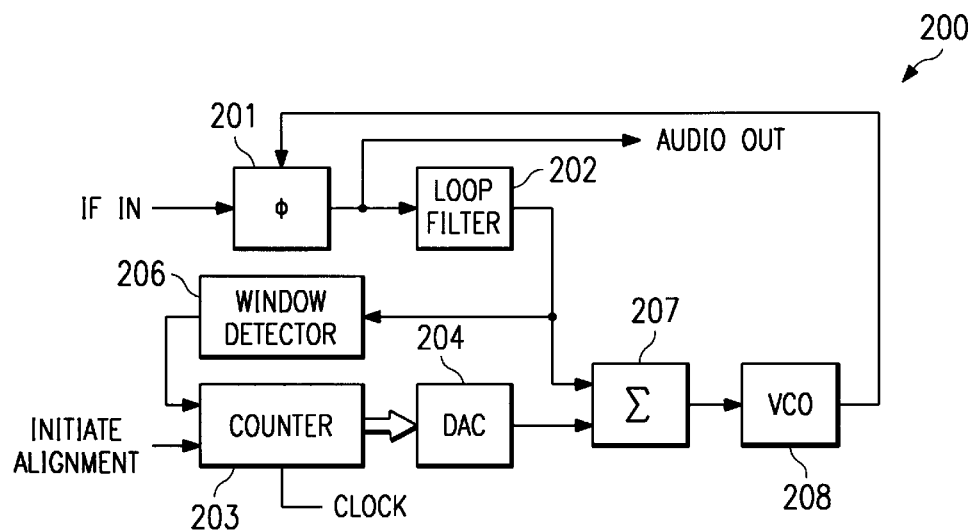
FIG. 2 shows in block diagram form a first embodiment demodulator in accordance with the present invention.
Figure 3:
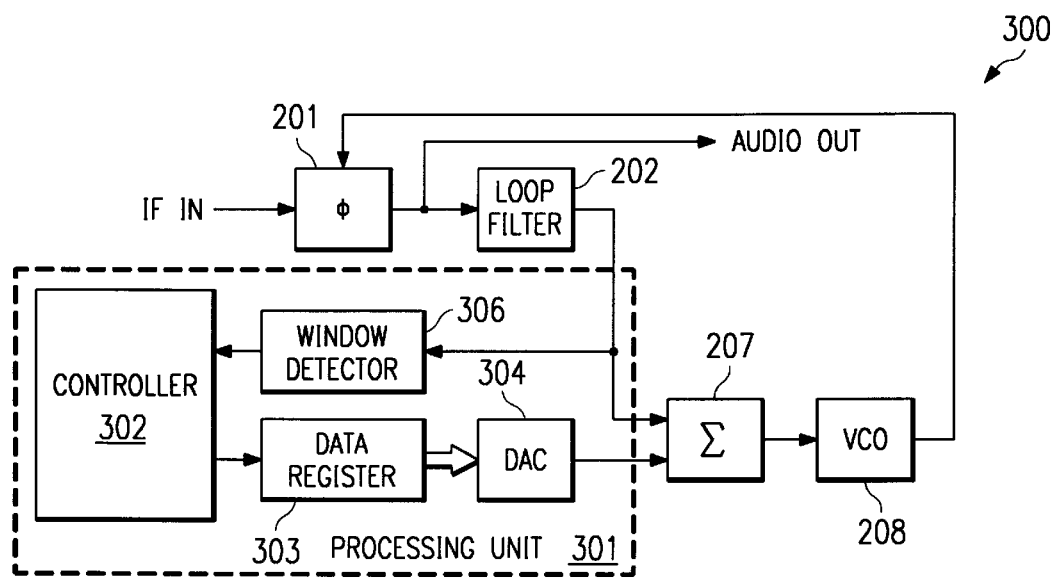
FIG. 3 shows a second embodiment demodulator in accordance with the present invention.

FIG. 2 and FIG. 3 illustrate alternative embodiments of PLL demodulators in accordance with the present invention. As shown at FIG. 2, the IF input signal comprising the FM or PM signal is applied to phase detector 201. The output of phase detector 201 is the demodulated output signal, typically an audio frequency signal. The output of phase detector 201 is coupled to the input of loop filter 202.

Loop filter 202 comprises an integrator having a time constant used to set the response time and bandwidth of demodulator 200. To provide high quality demodulation, loop filter 202 provides relatively narrow bandwidth on the order of 12–15 kHz, although the precise bandwidth will vary considerably based upon the bandwidth of the demodulated signal. The output of loop filer 202 is coupled to the input of summing circuit 207. Optionally, a low pass filter (not shown) can be placed in between loop filter 202 and summing circuit 207.

Summing circuit 207 also receives an input from a digital-to-analog converter (DAC) 204. DAC 204 generates an analog output voltage that is a function of the digital input signal received from counter 203. DAC 204 serves as a programmable voltage source and any suitable programmable or variable voltage source may be substituted. For purposes of practicing the present invention, any voltage source with an automatically variable or incrementing output is equivalent to DAC 204 used in the preferred embodiment. Desirably, DAC 204 is a CMOS device exhibiting low power consumption when operating as a fixed voltage source.

Summing circuit 207 adds together the output of loop filter 202 and the analog signal generated by DAC 204 and applies the summed signal to the control input of voltage control oscillator (VCO) 208. VCO 208 generates a continuous wave signal that is fed back to phase detector 201. The comparison of the IF input signal to the continuous wave signal generated by VCO 208 results in the demodulated audio output signal.

The output of loop filter 202 is also coupled to a window detector 206. Window detector 206 monitors the filtered output to determine when the filtered output is within a preselected acceptable voltage range. The acceptable voltage range is selected to indicate that PLL demodulator 200 is within its lock-in range. Window detector 206 generates a counter inhibit signal that is coupled to counter 203 upon detection of the preselected voltage window.

In operation, alignment is initiated by asserting an initiate alignment command to counter 203. Counter 203 can either latch the initiate alignment command using an edge triggered latch (not shown), or the initiate alignment command can be held high during the entire alignment process. Counter 203 then increments its digital value by one least significant bit each time a clock pulse is received. Counter 203 may increment at faster than one least significant bit or may increment at a variable rate. Variable rate incrementing may be desirable when the filtered voltage is well outside of the preselected window and faster alignment is desired. In most applications, however, single least significant bit increments are preferable. The clock pulse can be applied by an external source, an internal oscillator within counter 203, or by controller 103 shown in FIG. 1.

The incrementing digital output of counter 203 is applied to DAC 204 resulting in a ramped output voltage of the analog signal from DAC 204 applied to summing circuit 207. While the output of VCO 208 is sufficiently different from the input IF signal, the output of loop filter 202 remains quite large indicating that demodulator 200 is outside of its lock-in capability.

As the output of DAC 204 is ramped up, the output of VCO 208 will eventually pass into the lock-in range of the PLL. When this range is detected by window detector 206, counter 203 is inhibited and the output of counter 203 will remain constant. Preferably, when counter 203 is inhibited and inactive, it consumes little power and serves essentially as a low power latch holding the output of DAC 204 constant. This can be provided by implementing counter 203 in CMOS technology. Once demodulator 200 is within the lock-in range, the loop itself will adjust the output of the VCO 208 to an optimal signal for demodulating the IF input.

In accordance with the present invention, counter 203 and DAC 204 can have high resolution (i.e., greater than 10 bits), if desired. High resolution allows use of a very narrow band of loop filter 202 while still achieving tuning in an acceptable time. By improving loop filter 202 the audio output signal is more accurately demodulated.

FIG. 3 illustrates an alternative embodiment demodulator 300 in accordance with the present invention. Demodulator 300 operates in substantially similar way to demodulator 200. In demodulator 300 a processing unit 301 which may be a microprocessor, microcontroller, digital signal processing unit, or the like, incorporates a controller 302, window detector 306, data register 303 and a digital-to-analog converter 304. Controller 302 is programmed by an external alignment command or to self-generate an alignment command when necessary in response to monitoring the receiver's performance.

Controller 300 generates a digital word that is stored in register 303 and applied to digital-to-analog converter 304. During alignment, controller 302 adjusts the contents of data register 303 according to a linear or nonlinear algorithm or by obtaining values stored in a lookup table or memory (not shown) within controller 302. The value stored in data register 303 is continuously adjusted until the output of DAC 304 places demodulator 300 within lock-in range of the phase locked loop. The lock-in range is detected by monitoring the output of loop filter 202 with window detector 306. Window detector 306 may be implemented with, for example, an analog-to-digital converter and a digital comparator or by an analog comparator circuit and a means for generating an analog reference voltage. Any type of window detection circuit may be used in accordance with the present invention.

The components shown in processing unit 301 are typically available in commercially available digital signal processing units, microcontrollers, and microprocessors. Hence, demodulator 300 shown in FIG. 3 can be implemented using conventional PLL components such as phase detector 201, loop filter 202, summer 207 and VCO 208 implemented external to processing unit 301. Many receiver designs already incorporate a microprocessor, microcontroller, or digital signal processor that can be used to implement processing unit 301. By integrating the components for the modulator 300 as shown in FIG. 3, the self alignment feature in accordance with the present invention can be implemented with little additional cost in the receiver.

An improved phase locked loop demodulator is provided that uses few components and can be implemented with a self-tuning mechanism that provides automatic alignment. The alignment can be performed by the manufacturer, or preferably by the circuit user after all components in the circuit have been assembled. Also, alignment in accordance with the present invention can be performed periodically or in response to a detected change in receiver performance or ambient conditions.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

I claim:

1. A demodulator comprising:
   a phase detector receiving a modulated signal and a reference signal, the phase detector outputting a demodulated signal;
   a programmable voltage circuit outputting an analog voltage;
   a reference signal generator having an output coupled to provide the reference signal to the phase detector, the reference signal generator being responsive to the programmable voltage circuit and the demodulated signal; and
   a window detect circuit having an input coupled to the demodulated signal, the window detect circuit generating an inhibit signal when the demodulated signal is within preselected limits, the inhibit signal coupled to latch the programmable voltage circuit.

2. The demodulator of claim 1 wherein the programmable voltage circuit is a digital-to-analog converter (DAC) receiving a digital control signal and outputting an analog voltage.

3. The demodulator of claim 2 further comprising a digital counter coupled to provide the digital control signal to the DAC and coupled to an external clock signal and the inhibit signal.

4. The demodulator of claim 1 further comprising: a loop filter having an input coupled to the phase detector output and having an output coupled to the reference signal generator and to the window detect circuit.

5. The demodulator of claim 1 further comprising: a summing circuit having a first input coupled to the phase detector output and a second input coupled to the programmable voltage circuit, the summing circuit generating an output signal equal to the sum of the signals on the first and second inputs.

6. The demodulator of claim 1 wherein the reference signal generator comprises a voltage controlled oscillator.

7. A demodulator comprising:
   a phase detector receiving a modulated signal and a reference signal, the phase detector outputting a demodulated signal;
   a loop filter having an input coupled to the phase detector output and having an output;
   a digital-to-analog converter (DAC) receiving a digital control signal and outputting an analog voltage;
   a summing circuit having a first input coupled to the loop filter output and a second input coupled to the DAC output, the summing circuit generating an output signal equal to the sum of the signals on the first and second inputs;
   a voltage controlled oscillator (VCO) having an input coupled to receive the output signal of the summing circuit, the VCO having an output coupled to the phase detector, the VCO generating the reference signal on the VCO output; and
   a window detect circuit having an input coupled to the loop filter output, the window detect circuit generating a binary inhibit signal when the loop filter output is within preselected voltage limits.

8. The demodulator of claim 7 wherein the binary inhibit signal causes the DAC to hold its analog voltage output constant.

9. The demodulator of claim 7 further comprising a binary counter coupled to provide the control signal to the DAC and coupled to the window detect circuit, wherein the binary counter is inhibited from changing states in response to the binary inhibit signal.

10. A method for aligning a demodulator comprising the steps of:
   generating a demodulated signal having a value proportional to a detected phase difference between a modulated signal and a continuous wave reference signal;
   filtering the demodulated signal;
   generating an analog alignment signal;
   during alignment, incrementing the magnitude of the analog alignment signal until the filtered demodulated signal is within a preselected voltage window;
   adding the analog alignment signal and the filtered phase error signal to generate an analog reference signal; and
   converting the analog reference signal into the continuous wave reference signal.

11. The method of claim 10 further comprising a steps of:
   generating a binary inhibit signal when the filtered demodulated signal is within a preselected voltage window; and
   stopping the incrementing step in response to the binary inhibit signal.

12. The method of claim 10 further comprising a step of: providing a digital-to-analog converter (DAC) receiving a digital control signal and outputting the analog alignment signal.

13. The method of claim 12 further comprising: providing a digital counter coupled to provide the digital control signal; and
   periodically incrementing the digital counter by one least significant bit until the filtered demodulated signal is within the preselected voltage window.

14. The method of claim 12:
   providing a microcontroller coupled to provide the digital control signal and coupled to receive the filtered demodulated signal;
   determining when the filtered demodulated signal is within the preselected voltage window using the microcontroller;
   incrementing the digital control signal using the microcontroller until the microcontroller determines that the filtered demodulated signal is within the preselected voltage window.

15. A radio receiver comprising:
a mixer receiving a radio frequency (RF) signal and a first reference signal, the mixer outputting an intermediate frequency (IF) signal;
a local oscillator providing the first reference signal to the mixer;
a phase detector receiving the IF signal and a second reference signal, the phase detector outputting a demodulated signal;
a filter coupled to receive the demodulated signal and output a filtered demodulated signal;
a programmable voltage circuit outputting an analog voltage;
a reference signal generator having an output coupled to provide the second reference signal to the phase detector, the reference signal generator being responsive to the programmable voltage circuit and the filtered demodulated signal; and
a window detect circuit having an input coupled to the filtered demodulated signal, the window detect circuit generating an inhibit signal when the filtered demodulated signal is within preselected voltage limits, the inhibit signal coupled to latch the programmable voltage circuit.

16. The radio receiver of claim 15 wherein the programmable voltage circuit further comprises:

a digital-to-analog converter having an input receiving a digital control signal and an output coupled to supply the analog voltage;
a digital counter coupled to provide the digital control signal to the digital-to-analog converter, the digital counter having a clock input and an inhibit input coupled to receive the inhibit signal, wherein the digital control signal is incremented when a signal is asserted on the clock line and the digital control signal is latched when a signal is asserted on the inhibit input.

17. The radio receiver of claim 15 wherein the programmable voltage circuit further comprises:
a digital-to-analog converter having an input receiving a digital control signal and an output coupled to supply the analog voltage;
a data register coupled to the digital-to-analog converter and holding the digital control signal;
a programmable processing circuit coupled to receive the inhibit signal and programmed to vary the digital control signal until the inhibit signal is received.

18. The demodulator of claim 7 further comprising a microcontroller having a register coupled to the DAC for holding the control signal, and an input receiving the binary inhibit signal wherein the microcontroller is programmed to hold the register value constant upon receipt of the inhibit signal.

* * * * *